United States Patent
Hammerschmidt

(10) Patent No.: US 9,645,029 B2
(45) Date of Patent: May 9, 2017

(54) FORCE FEEDBACK LOOP FOR PRESSURE SENSORS

(71) Applicant: Infineon Technologies AG, Neubiberg (DE)

(72) Inventor: Dirk Hammerschmidt, Villach (AT)

(73) Assignee: Infineon Technology AG, Neubiberg (DE)

( * ) Notice: Subject to any disclaimer, the term of this patent is extended or adjusted under 35 U.S.C. 154(b) by 352 days.

(21) Appl. No.: 14/246,244

(22) Filed: Apr. 7, 2014

(65) Prior Publication Data

US 2015/0285701 A1 Oct. 8, 2015

(51) Int. Cl.
*G01L 9/00* (2006.01)
*B81B 3/00* (2006.01)
*G01L 1/14* (2006.01)
*G01L 1/08* (2006.01)

(52) U.S. Cl.
CPC .......... *G01L 9/0072* (2013.01); *B81B 3/0059* (2013.01); *G01L 1/086* (2013.01); *G01L 1/144* (2013.01)

(58) Field of Classification Search
CPC ........ G01L 9/0072; G01L 1/144; G01L 1/086
USPC .................... 73/724, 723, 715, 700
See application file for complete search history.

(56) References Cited

U.S. PATENT DOCUMENTS

| | | | | |
|---|---|---|---|---|
| 3,911,738 A * | 10/1975 | Fischer | ............... | G01L 1/144 73/514.18 |
| 4,922,756 A * | 5/1990 | Henrion | ............... | F16F 15/073 73/514.18 |
| 5,454,266 A * | 10/1995 | Chevroulet | ............ | G01P 15/131 73/514.18 |
| 5,641,911 A * | 6/1997 | Ryhanen | ............... | G01L 11/008 73/715 |
| 5,750,903 A * | 5/1998 | Ryhanen | ............... | G01F 1/383 73/861.48 |
| 6,023,960 A * | 2/2000 | Abrams | ............... | G01P 21/00 73/1.01 |
| 6,386,032 B1 * | 5/2002 | Lemkin | ............... | G01M 1/225 73/460 |
| 6,496,348 B2 * | 12/2002 | McIntosh | ............. | B81B 3/0086 361/115 |
| 6,513,388 B1 * | 2/2003 | Oja | ............... | G01G 7/06 73/777 |
| 6,630,657 B1 * | 10/2003 | Seppa | ............... | G01C 19/5726 250/221 |
| 7,155,979 B2 * | 1/2007 | Lasalandra | ........ | G02B 26/0841 324/661 |

(Continued)

OTHER PUBLICATIONS

Ismail, Ayman. Designing Closed-Loop Mems-Based Capacitive Inertial Sensors. Electronic Engineering Times Europe, Mar. 2013.

*Primary Examiner* — Lisa Caputo
*Assistant Examiner* — Nathaniel T Woodward
(74) *Attorney, Agent, or Firm* — Eschweiler & Potashnik, LLC

(57) ABSTRACT

A pressure sensor system comprises a force feedback loop. The force feedback loop is configured to receive a measured pressure sensor signal and generate a feedback signal based on the measured pressure and an electrostatic force. The electrostatic force is generated based on the feedback signal and combined with the measured force keeping the resultant sensor signal stable.

18 Claims, 7 Drawing Sheets

(56) References Cited

U.S. PATENT DOCUMENTS

| | | | |
|---|---|---|---|
| 7,481,111 B2 * | 1/2009 | Caminada | G01C 19/5726 |
| | | | 73/503.3 |
| 8,352,030 B2 | 1/2013 | Denison | |
| 8,650,963 B2 * | 2/2014 | Barr | G01L 11/008 |
| | | | 73/170.29 |
| 2008/0252385 A1 * | 10/2008 | Kawai | G01L 1/10 |
| | | | 331/25 |
| 2014/0240156 A1 * | 8/2014 | Ismail | H03M 1/48 |
| | | | 341/143 |

* cited by examiner

FORCE FEEDBACK LOOP FOR PRESSURE SENSORS

FIELD

The present disclosure is in the field of pressure sensors, for example, MEMS based pressure sensors and a force feedback loop circuit associated therewith.

BACKGROUND

A capacitive pressure sensor uses a moveable diaphragm and a pressure cavity to create a variable capacitor. The variable capacitor exhibits a capacitance that varies in correspondence to forces introduced by the measured pressure.

DETAILED DESCRIPTION

Figure 1:
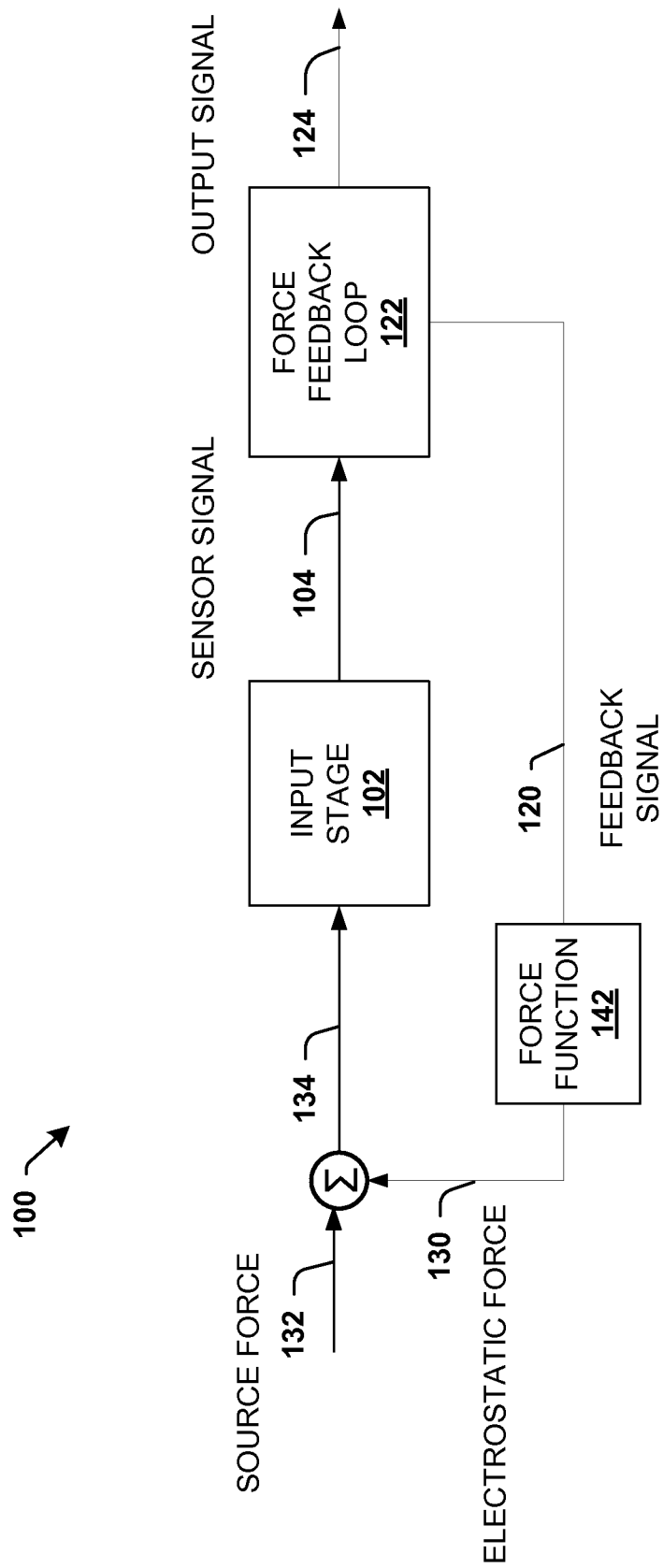
FIG. 1 is a block diagram illustrating a signal processing system for a pressure sensor.

The present disclosure will now be described with reference to the attached drawing figures, wherein like reference numerals are used to refer to like elements throughout, and wherein the illustrated structures and devices are not necessarily drawn to scale.

A force feedback loop is utilized in various MEMS inertia sensor systems and operates to eliminate a displacement of a moving mass. An electrostatic force inverse to the external force is generated based on a feedback signal. The electrostatic force compensates external forces and keeps the mass in a balanced position. In such ways, the systems are linearized. Furthermore, the force feedback loop enables a self-test for the systems.

Systems and methods are disclosed that incorporate a force feedback loop into a pressure sensor system. The force feedback loop provides a control signal based on a measured pressure to control an electrostatic force applied to the pressure sensor. The electrostatic force is applied to the pressure sensor together with the measured pressure so that an overall deflection of a pressure sensor's diaphragm is generally stable for different pressure measurements. By adding the electrostatic force to the measured pressure, a sensitivity of the pressure sensor system is improved, especially for low pressure measurement. Self-tests and self-calibration of the pressure sensor system are simplified as well. Besides controlling the electrostatic force applied to the pressure sensor, the control signal is also processed as an output signal of the pressure sensor system. The output signal indicates the measured pressure and can be fed into a processor and/or a displayer in a following stage. In some embodiments, the overall deflection of the diaphragm is equal to or larger than a deflection caused by a maximum pressure alone.

FIG. 1 is a block diagram illustrating a signal processing system 100. The system 100 measures a source force 132 and generates an output signal 124 based on the measured source force.

The system 100 includes an input stage 102, a force feedback loop 122 and a force function 142. The input stage 102 measures a source force 132 and generates a capacitive signal 104 in response to the measured source force 132. The force feedback loop 122 receives the capacitive signal 104 and generates an output signal 124 and a feedback signal 120 based on the capacitive signal 104. The force function 142 generates an electrostatic force 130 based on the feedback signal 120. The electrostatic force 130 is combined with the source force 132 to generate an overall force 134. In some embodiments, the overall force 134 is controlled to be a constant by the feedback signal 120 for different source force measurements. So is an overall capacitance generated thereof. The overall capacitance has a stable value which can be decided by a programmable target capacitor included in the force feedback loop 122.

Notably, the overall capacitance is independent of the measured source force for the disclosed closed loop system 100 in the embodiments. When a new, different source force comes to be measured, the overall capacitance changes based on the new source force at the instant moment and generates the capacitive signal 104. The output signal 124 and the feedback signal 120 are generated in succession based on the capacitive signal 104. Then the feedback signal 120 controls the electrostatic force 130 so that the overall force, and its resultant overall capacitance, changes back to the stable value.

In some embodiments, the system 100 can be a pressure sensor system. The input stage 102 can be a pressure sensor and the measured source force 132 can be a pressure force. The overall capacitance is generated by an overall deflection of a diaphragm of the pressure sensor. The overall deflection is based on the overall force 134. The feedback signal 120 can be a feedback driving voltage that provides a bias for the capacitive pressure measurements.

Figure 2:
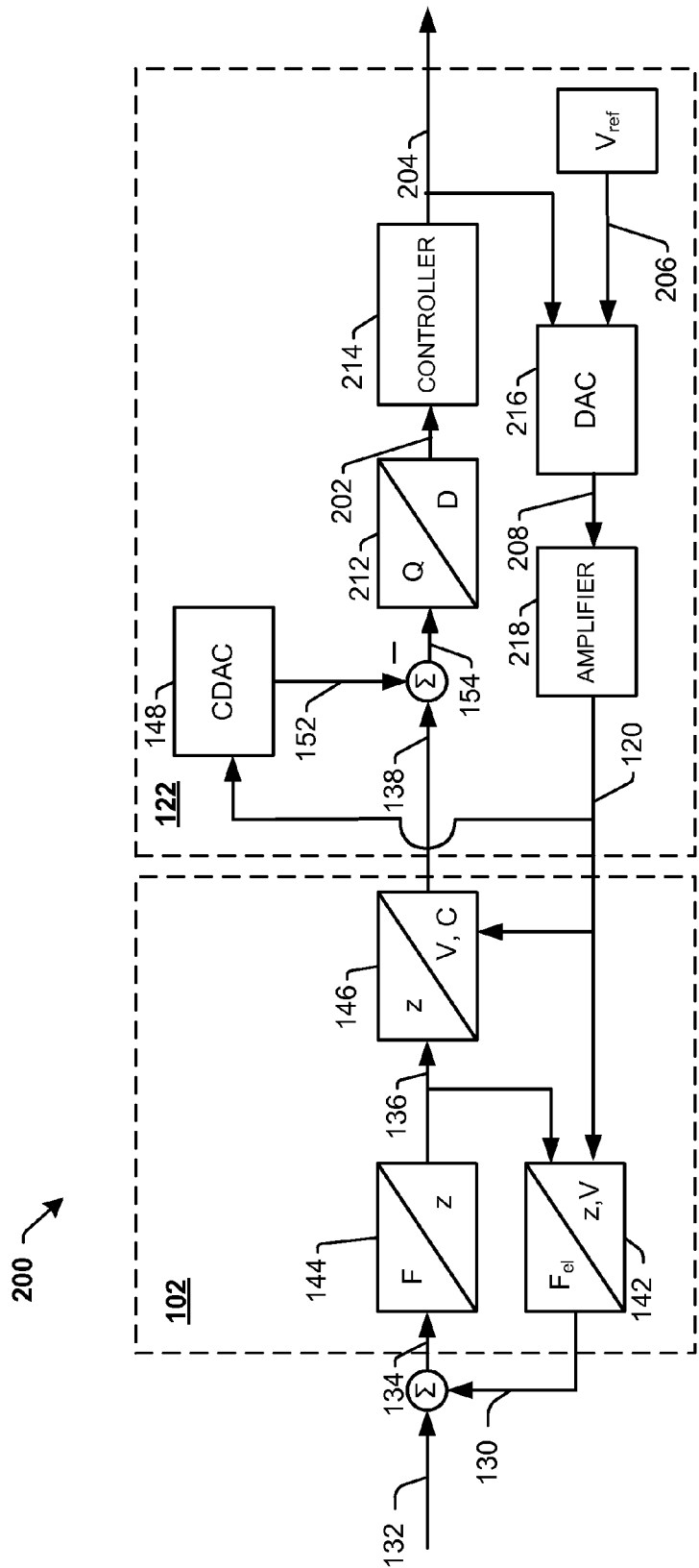
FIG. 2 is a detailed block diagram illustrating a pressure sensor system according to some embodiments.

FIG. 2 shows a more detailed block diagram illustrating a pressure sensor system 200 according to some embodiments. It is appreciated that components of the system 200 disclosed below can be implemented by using programming and/or engineering techniques to produce software, firmware, hardware, or any combination thereof.

The pressure sensor system 200 comprises a pressure sensor 102 and a force feedback loop 122. The pressure sensor 102 measures a pressure and generates a sensor signal based on the measured pressure. The force feedback loop 122 receives the sensor signal and generates an output signal 204 and a feedback signal 120 based on the sensor signal. An electrostatic force 130 is generated based on the feedback signal 120 and is combined with a measured pressure force 132 to generate an overall force 134. The pressure sensor 102 can comprise a capacitor comprising a counter plate and a moveable diaphragm as a force collector. A deflection 136 of the diaphragm is generated by the overall force 134 exerted on the diaphragm and is measured by measuring an overall capacitance of the capacitor. The feedback signal 120 is adjusted by the force feedback loop 122 in response to the sensor signal so that the deflection of the diaphragm is independent of the measured pressure. The overall capacitance caused by the overall force 134 (i.e., the source force and the electrostatic force) is equal to or greater than a capacitance that a maximum measured pressure (a maximum source force) can cause on the pressure sensor. In some embodiments, the pressure sensor system can be integrated in a micro-electro-mechanical system (MEMS). The system 200 can be fabricated on a single die or some separated dies.

Still referring FIG. 2, in some embodiments, the pressure sensor 102 comprises a Laplace transfer function component 144, an electrostatic force generation function component 142 and a measurement function component 146 describing a dynamic behavior of the pressure sensor 102. The electrostatic force 130 depends on the feedback signal 120 and the deflection 136. The measurement function component 146 generates the overall capacitance based on the deflection 136. The feedback signal 120 can be a feedback driving voltage applied to the input stage 102 including the electrostatic force generation function component 142 and the measurement function component 146. A measurement charge 138 can be generated by a product of the capacitance and the driving feedback voltage 120. Then the measurement charge 138 is compared to a target charge 152 at a summing node. The target charge 152 is programmed by a capacitive digital to analog convertor (CDAC) 148 in some embodiments. A target capacitance is set by programming a capacitor network in some embodiments. A bias voltage of the CDAC can be provided by the feedback driving voltage 120 in the embodiments. Then the charge difference 154 between the measurement charge 138 and the target charge 152 is converted to a digital signal 202 and fed into a controller 214. The controller 214 can be, for example, a proportional-integral-derivate (PID) controller or a state space controller that processes the charge difference signal and generates a control output signal 204. The control output signal 204 is employed to generate a new electrostatic force after the processing so that the charge difference 154 becomes zero after feeding the new electrostatic force 130 to the pressure sensor 102. The digital control output signal 204 is also exported as the digital output signal of the pressure sensor system 200. In order to provide enough bias voltage to generate a proper electrostatic force, in one embodiment the control output signal 204 is converted to a voltage signal 208 by a digital to analog convertor (DAC) 216 and then amplified to a new driving feedback voltage 120 by an amplifier 218. In some embodiments, the driving feedback voltage 120 is greater than a supply voltage of the system 200. A charge pump can be applied as the amplifier 218.

Figure 3:
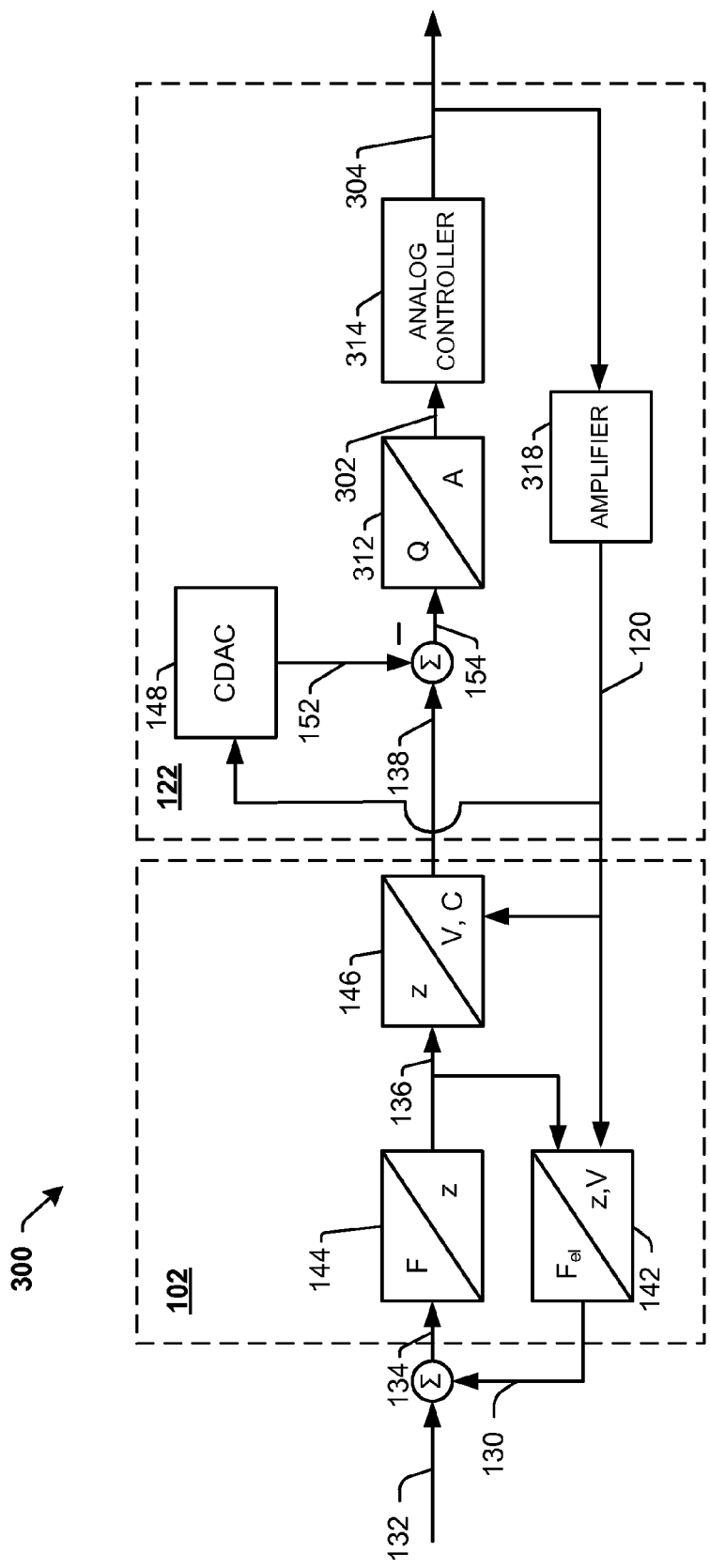
FIG. 3 is a detailed block diagram illustrating a pressure sensor system according to some other embodiments.

In the embodiments shown in FIG. 2, for example, in a CMOS technology, the charge difference 154 is converted into the digital signal 202. In some other embodiments, the charge difference can be converted into an analog signal as well. FIG. 3 shows a block diagram illustrating a pressure sensor system 300 wherein the charge difference 154 is converted into a analog signal 302 and then processed by an analog controller 314. A voltage signal 304 is exported as the output signal and amplified by an amplifier 318 to generate the feedback driving voltage 120.

Figure 4:
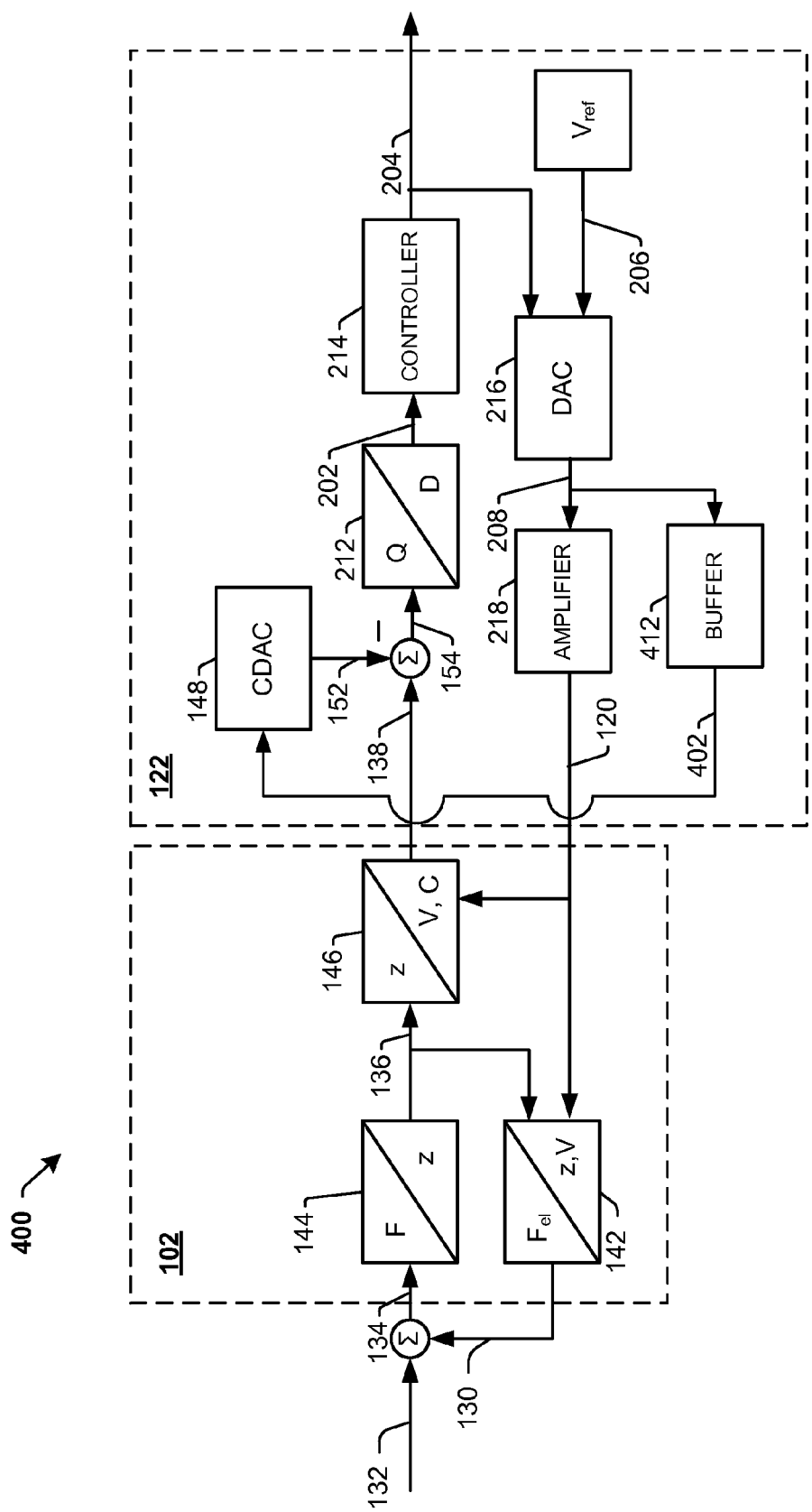
FIG. 4 is a block diagram illustrating a pressure sensor system according to some other embodiments.

FIG. 4 shows another block diagram illustrating a pressure sensor system according to some other embodiments. In FIG. 4, a bias voltage 402 of the CDAC 148 is provided by the voltage signal 208 after being passed through a buffer 412 instead of being provided by the feedback driving voltage 120 as shown in FIG. 2. These embodiments can be utilized when the measured sensor capacitance is relatively small. The target capacitance used to do the comparison may be provided by a capacitor network and the target capacitance cannot be too small. By applying a smaller bias voltage 402 for CDAC 148, the measured sensor capacitance range is expanded. These embodiments can also be utilized when the feedback driving voltage 120 is larger than a voltage compliance of the capacitors used in CDAC 148. Further it may be used in a setup where the clock for the feedback is faster than the clock for the switched bias of the sensor bridge. In this case the driver can be implemented in a way that it charges the feedback network faster than the amplifier.

Figure 5:
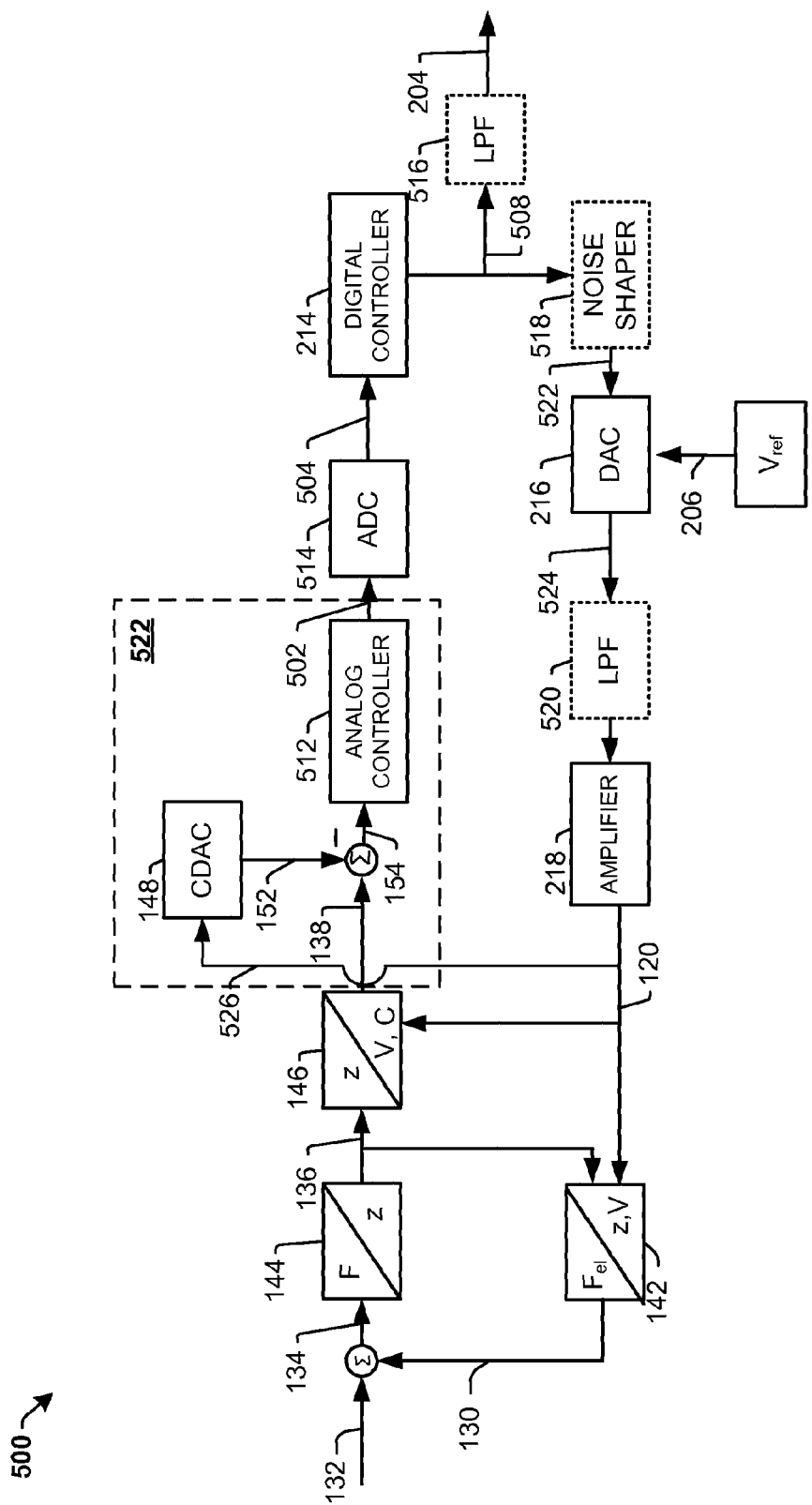
FIG. 5 is a block diagram illustrating a pressure sensor system according to some other embodiments.

FIG. 5 shows a block diagram illustrating a pressure sensor system 500 according to some other embodiments wherein analog and digital parts are utilized in a control loop of the system.

The electrostatic force 130 is combined with the measured pressure force 132 to generate the overall force 134. The overall force 134 causes the deflection 136 of the diaphragm through the transfer function component 144. The deflection 136 affects a measured capacitance through the measurement function component 146 and the electrostatic force 130 through the electrostatic force generation function component 142. This process can be described by a simplified physical model of a plate capacitor. The measured capacitance is then multiplied by the feedback driving voltage 120 to generate the measurement charge 138. The measurement charge 138 is compared to the target charge 152 programmed by the capacitive digital to analog convertor (CDAC) 148. A bias 526 of the CDAC 148 can be provided by the feedback driving voltage 120 or a voltage signal before being amplified. Then the charge difference 154 between the measurement charge 138 and the target charge 152 is processed by an analog controller 512. The analog controller 512 can be an integrator in one embodiment. The analog controller 512 can further comprises a first integrator stage and a second analog stage having an interpolation character. In one embodiment, the first integrator stage has a clock frequency that is relatively lower than the rest of the control loop. In one embodiment, the second analog stage can be a sigma delta modulator having a clock frequency that is relatively higher than the first integrator stage. The integrator introduces a DC pole into an open loop before a signal is quantized. This pole turns into a zero for a quantization noise transfer function of the closed control loop. Thus a resolution of an in succession analog to digital convertor (ADC) 514 is reduced and so is a chip area and a power consumption of the system 500. A resultant digital signal 504 is generated and fed into the controller 214.

A processed digital signal 508 is generated through the controller 214 based on the digital signal 504. The processed digital signal 508 can be filtered by a low pass filter 516 and exported as the output signal 204. The processed digital signal 508 also passes through an optional noise shaper 518 and the DAC 216, and is amplified by the amplifier 218. Another low pass filter 520 can be applied before the amplifier 218 as a decimation element to adapt to a possible slower speed of the charge pump used for the amplifier 218.

Figure 6:
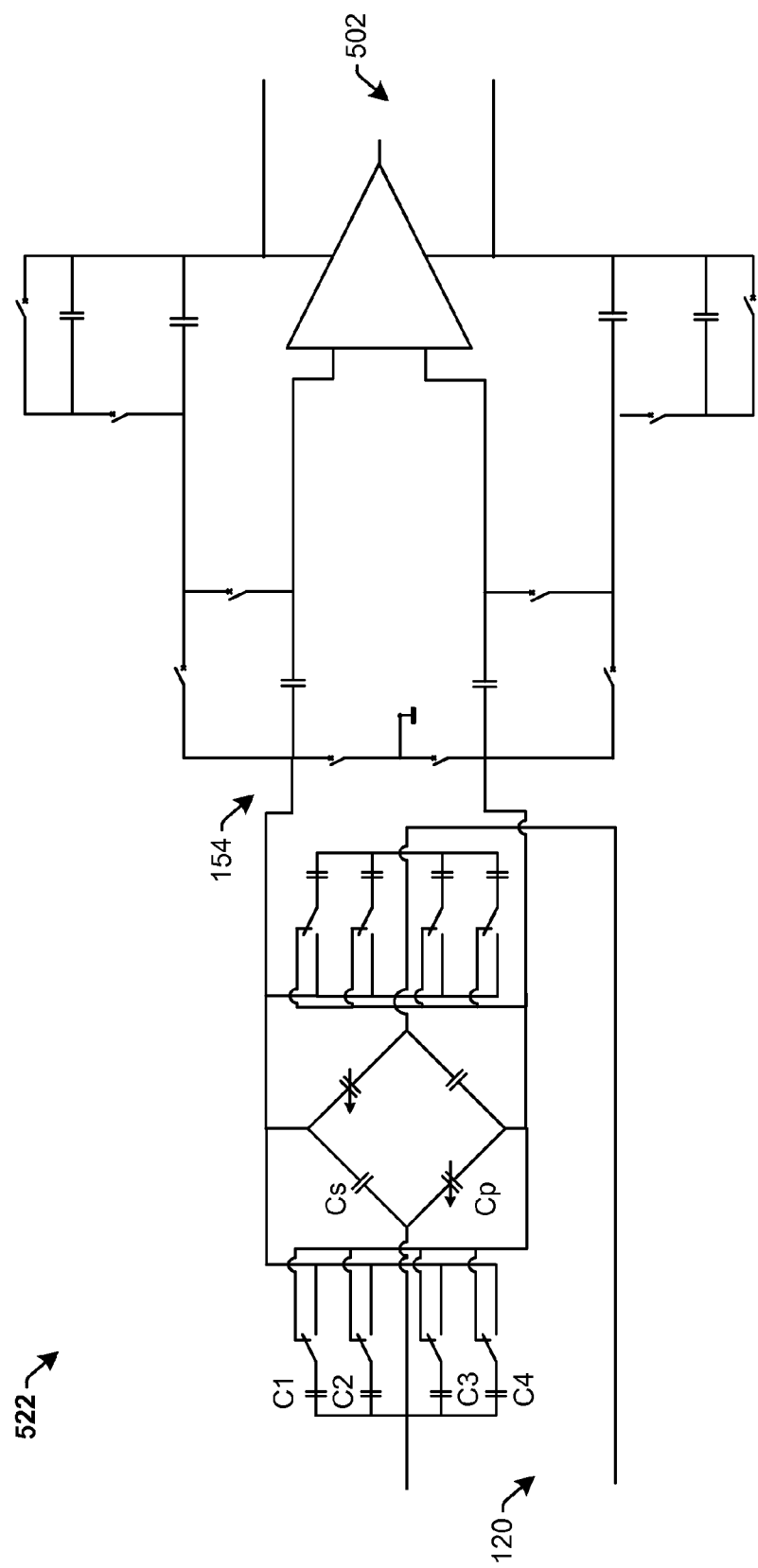
FIG. 6 is a diagram illustrating an integrator stage of a pressure sensor system according to some embodiments.

FIG. 6 is a block diagram illustrating an integrator stage 522 that can be utilized in the above system 500 in FIG. 5 in accordance with one embodiment. The integrator stage 522 comprises a switched capacitor integrator circuit. The integrator stage 522 sets the target capacitance value by connecting a programmable array of capacitors, for example, C1, C2, C3 and C4, in parallel to elements of the sensor bridge Cp or Cs. This implementation relaxes settling requirements for a charging and discharging process of the capacitor bridge especially when the charging pump is applied for the amplifier 218 in FIG. 5.

Figure 7:
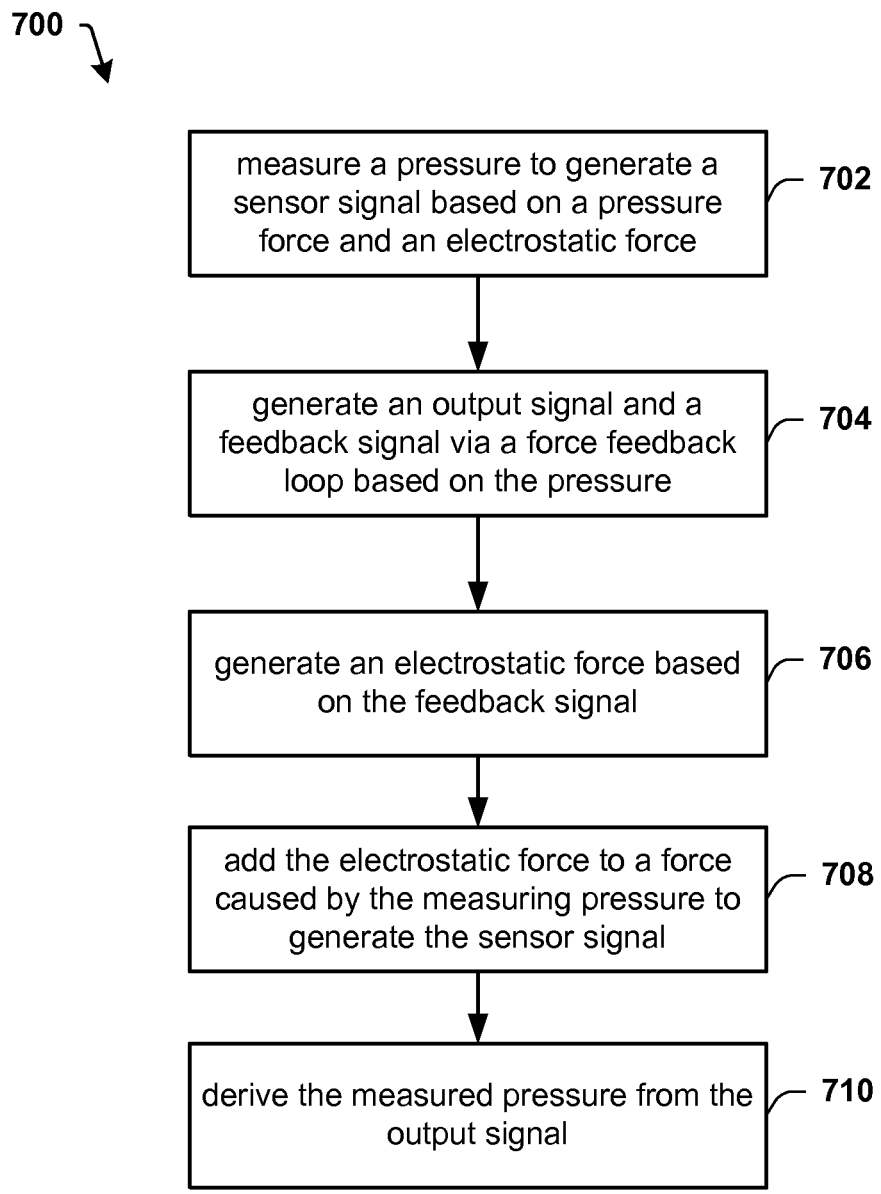
FIG. 7 is a flow diagram illustrating a method of operating a pressure sensor system.

FIG. 7 is a flow diagram illustrating a method 700 of operating a pressure sensor system with a force feedback loop. The above systems and components can be referenced to facilitate understanding of the method 700. Further, the method 700 can be at least partially incorporated by the above systems and/or components.

The method 700 generates an output signal and a feedback signal of a pressure sensor system. The output signal and the feedback signal is generated from the force feedback loop by setting a proper bias to drive an electrostatic force exerted on the pressure sensor system such that an overall force of a measured pressure force and the electrostatic force is stable at a target value. The target value is set by the force feedback loop.

The method 700 begins at block 702, wherein a sensor signal is provided based on a force caused by a pressure and an electrostatic force. In some embodiments, the sensor signal is generated by a MEMS capacitive sensor device. An overall force of the pressure force and the electrostatic force causes a deflection of a diaphragm. The deflection signal can be converted to a capacitance signal or further be converted to a charge signal by applying a suitable bias.

A control signal is provided via a force feedback loop at block 704. An output signal and a feedback signal is generated based on the control signal. The control signal is generated by comparing the sensor signal, for example, the charge signal to a pre-set target value.

The resultant feedback signal generates the electrostatic force at block 706 and the electrostatic force is applied together with a force caused by the measured pressure to compensate the difference between the sensor signal and the target value at 708.

At 710, the measured pressure is derived from the output signal.

It is appreciated that the above methods and variations thereof can be combined and utilized interchangeably. The claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of system that may be used to implement methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

A pressure sensor system includes a pressure sensor and a force feedback loop. The pressure sensor is configured to measure a pressure and to generate a sensor signal based on the measured pressure. Further, the force feedback loop configured to receive the sensor signal and to generate an output signal and a feedback signal based on the sensor signal. The feedback signal is utilized to generate an electrostatic force on the pressure sensor in addition to a force caused by the measured pressure.

A signal processing system includes an input stage, a force feedback loop and a force function. The input stage is configured to measure a source force and to generate a capacitive signal in response to the measured source force. The force feedback loop is configured to receive the capacitive signal and to generate an output signal and a feedback driving voltage based on the capacitive signal. The force function configured to generate an electrostatic force based on the feedback driving voltage. The electrostatic force is combined with the source force to generate an overall force.

A method of operating a pressure sensor system is disclosed. A pressure is using a pressure sensor to generate a sensor signal based on the measured pressure. An output signal and a feedback signal are generated via a force feedback loop based on the sensor signal. An electrostatic force is generated based on the feedback signal. Then the electrostatic force is exerted to the pressure sensor in addition to a force caused by the measured pressure to generate the sensor signal.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:
1. A pressure sensor system, comprising:
 a pressure sensor configured to measure a force caused by a pressure and to generate a sensor signal based on the measured pressure force and an electrostatic force; and
 a force feedback loop configured to receive the sensor signal and to generate an output signal and a feedback signal based on the sensor signal;
 wherein the feedback signal is utilized to generate the electrostatic force on the pressure sensor, wherein the electrostatic force is exerted on the pressure sensor in addition to the pressure force;
 wherein the pressure sensor is a capacitive sensor and is configured to generate an overall capacitance associated with the sensor signal, wherein the overall capacitance is caused by an overall force exerted to the pressure sensor by the electrostatic force and the measured pressure, wherein the overall capacitance is equal to or greater than a capacitance caused by a maximum measured pressure applied to the pressure sensor;
 wherein the feedback signal or the output signal is converted to a bias voltage to provide a target charge to be compared with a measurement charge.

2. The system of claim 1, wherein the force feedback loop is configured to adjust the feedback signal in response to the sensor signal so that the overall capacitance caused by the overall force is maintained at a stable value over a variation of pressure measurements.

3. The system of claim 1, wherein the pressure sensor is integrated in a micro-electro-mechanical system (MEMS).

4. The system of claim 1, wherein the output signal comprises a digital or analog signal.

5. A signal processing system, comprising:
 an input stage configured to measure a source force and to generate a capacitive signal in response to the measured source force and an electrostatic force;

a force feedback loop configured to receive the capacitive signal and to generate an output signal and a feedback driving voltage based on the capacitive signal; and a force function component configured to generate the electrostatic force based on the feedback driving voltage;

wherein the electrostatic force is combined with the measured source force to generate an overall force;

wherein the force feedback loop comprises an analog controller including a first integrator stage configured to run at a relatively lower clock frequency and a second analog stage having an interpolation character and configured to run at a relatively higher frequency;

wherein the first integrator stage introduces a DC pole into an open loop before a signal is quantized, wherein the DC pole turns into a zero for a quantization noise transfer function of a closed control loop.

6. The system of claim 5, wherein an overall capacitance of the input stage generated by the overall force is maintained at a stable value over a variation of source force measurements.

7. The system of claim 5, wherein the feedback driving voltage is used as a bias voltage both to provide a target charge to be compared with a measurement charge and to generate the electrostatic force.

8. A signal processing system, comprises:
an input stage configured to measure a source force and to generate a capacitive signal in response to the measured source force and an electrostatic force;
a force feedback loop configured to receive the capacitive signal and to generate an output signal and a feedback driving voltage based on the capacitive signal;
a force function component configured to generate the electrostatic force based on the feedback driving voltage;
a controller configured to compare a measurement charge and a target charge, and generate a control signal in response to a charge difference;
a digital to analog converter (DAC) configured to convert the control signal to a feedback voltage;
an amplifier configured to amplify the feedback voltage to form the feedback driving voltage; and
a switched capacitor circuit configured to generate a comparison result of the measurement charge and the target charge;
wherein the switched capacitor circuit comprises a programmable array of capacitors connected in parallel to a capacitor of a sensor bridge.

9. The system of claim 8, wherein the output signal is based on the control signal.

10. The system of claim 8, wherein the feedback driving voltage is applied to the input stage and the controller as a bias voltage.

11. The system of claim 8, wherein the feedback driving voltage is applied to the input stage as a bias voltage, and the feedback voltage is applied to the controller as another bias voltage.

12. The system of claim 8, wherein the amplifier is a charge pump configured to amplify the feedback voltage greater than a supply voltage of the system.

13. The system of claim 8, wherein the digital controller is a proportional-integral-derivate (PID) controller or a state space controller.

14. The system of claim 8, further comprising an analog integrator between the input stage and the controller.

15. The system of claim 14, wherein the analog integrator comprises a first integrator stage configured to run at a relatively lower clock frequency and a sigma delta modulator configured to run at a relatively higher frequency.

16. A method of operating a pressure sensor system comprises:
using a pressure sensor to generate a sensor signal based on the measured pressure and an electrostatic force applied to the pressure sensor;
comparing the sensor signal with a target charge to generate an output signal and a feedback signal via a force feedback loop;
converting the feedback signal to a voltage signal and amplifying the voltage signal to a feedback driving voltage greater than the voltage signal;
generating a new electrostatic force using the feedback driving voltage as a first bias voltage; and
applying the new electrostatic force to the pressure sensor in addition to a force caused by the measured pressure to generate a new sensor signal;
wherein the target charge is generate using the voltage signal as a second bias voltage, the second bias voltage being smaller than the first bias voltage.

17. The method of claim 16, wherein a sensor capacitance and a programmable target capacitance are compared or substracted.

18. The method of claim 16, wherein the feedback signal is generated so that an overall force of the electrostatic force and the measured pressure generates a stable capacitance that is equal to or greater than a capacitance caused by a maximum measured pressure.

* * * * *